US006923860B1

(12) United States Patent
Karr et al.

(10) Patent No.: US 6,923,860 B1
(45) Date of Patent: Aug. 2, 2005

(54) OXIDATION OF MATERIAL FOR TUNNEL MAGNETO-RESISTIVE SENSORS

(75) Inventors: Brian W. Karr, Savage, MN (US); Mark T. Kief, Savage, MN (US); Janusz J. Nowak, Eden Prairie, MN (US)

(73) Assignee: Seagate Technology LLC, Scotts Valley, CA (US)

(*) Notice: Subject to any disclaimer, the term of this patent is extended or adjusted under 35 U.S.C. 154(b) by 167 days.

(21) Appl. No.: 10/400,903

(22) Filed: Mar. 27, 2003

Related U.S. Application Data

(60) Provisional application No. 60/368,235, filed on Mar. 28, 2002, and provisional application No. 60/368,223, filed on Mar. 28, 2002.

(51) Int. Cl.⁷ ............................................ C30B 25/12
(52) U.S. Cl. .......................... 117/89; 117/93; 117/95; 117/102; 428/141
(58) Field of Search ............................ 117/89, 93, 95, 117/102; 428/141

(56) References Cited

U.S. PATENT DOCUMENTS 6,023,395 A * 2/2000 Dill et al. .................. 360/113
6,114,719 A * 9/2000 Dill et al. .................. 257/295
6,335,081 B1   1/2002 Araki et al.

OTHER PUBLICATIONS

Baltz, Alfred. *Journal of Applied Physics* "Influence of Vacuum Conditions on Epitaxially Grown Permalloy Films." vol. 34, No. 6, Jun. 1963.

* cited by examiner

Primary Examiner—Felisa Hiteshew
(74) Attorney, Agent, or Firm—Brendan J. Hanley

(57) ABSTRACT

The present invention is a tunneling magnetoresistive (TMR) stack configured to operate in a current-perpendicular-to-plane (CPP) mode, wherein a sense current flows substantially perpendicular to a longitudinal plane of the barrier layer. The TMR stack has a plurality of layers including a barrier layer. The barrier layer may made of titanium and may be oxidized with an aggressive oxidation method, such as with UV illumination, for a predetermined time period. The barrier layer may be formed on a first ferromagnetic layer before oxidation, and then a second ferromagnetic layer may be formed on the oxidized barrier layer. The TMR stack exhibits an increased magnetoresistive (MR) ratio, a lower RA product, a higher breakdown voltage of the TMR stack, and greater thermal stability.

25 Claims, 7 Drawing Sheets

OXIDATION OF MATERIAL FOR TUNNEL MAGNETO-RESISTIVE SENSORS

CROSS REFERENCE TO RELATED APPLICATIONS

This application claims the benefit of United States Provisional Application No. 60/368,235, filed Mar. 28, 2002, and entitled "TI Oxide Barrier Materials For Tunnel Magneto-Resistive Sensors," and United States Provisional Application No. 60/368,223, filed Mar. 28, 2002, and entitled "UV Oxidation of Material For Tunnel Magneto-Resistive Sensors."

BACKGROUND OF THE INVENTION

1. Field of the Invention

The present invention relates generally to a magnetoresistive sensor for use in a magnetic read head. In particular, the present invention relates to a tunneling magnetoresistive (TMR) read sensor having an enhanced magnetoresistive response.

2. Related Art

Magnetoresistive read sensors, such as giant magnetoresistive (GMR) read sensors, are used in magnetic data storage systems to detect magnetically encoded information stored on a magnetic data storage medium such as a magnetic disc. A time-dependent magnetic field from a magnetic medium directly modulates the resistivity of the GMR read sensor. A change in resistance of the GMR read sensor can be detected by passing a sense current through the GMR read sensor and measuring the voltage across the GMR read sensor. The resulting signal can be used to recover the encoded information from the magnetic medium.

A typical GMR read sensor configuration is the GMR spin valve, in which the GMR read sensor is a multi-layered structure formed of a nonmagnetic spacer layer positioned between a synthetic antiferromagnet (SAF), which is generally known as a pinned layer, and a ferromagnetic free layer. The magnetization of the SAF is fixed, typically normal to an air bearing surface of the GMR read sensor, while the magnetization of the free layer rotates freely in response to an external magnetic field. The SAF includes a reference layer and a pinned layer that are magnetically coupled by a coupling layer such that the magnetization direction of the reference layer is opposite to the magnetization of the pinned layer. The resistance of the GMR read sensor varies as a function of an angle formed between the magnetization direction of the free layer and the magnetization direction of the reference layer of the SAF. This multi-layered spin valve configuration allows for a more pronounced magnetoresistive effect, i.e. greater sensitivity and higher total change in resistance, than is possible with anisotropic magnetoresistive (AMR) read sensors, which generally consist of a single ferromagnetic layer.

A TMR read sensor is similar in structure to a GMR spin valve, but the physics of the device are different. For a TMR read sensor, rather than using a spacer layer, a barrier layer is positioned between the free layer and the SAF. Aluminum Oxide (AlO) is commonly used as a material for the barrier layer. Electrons must tunnel through the barrier layer. A sense current flowing perpendicularly to the plane of the layers of the TMR read sensor experiences a resistance that is proportional to the cosine of an angle formed between the magnetization direction of the free layer and the magnetization direction of the reference layer of the SAF.

A pinning layer is typically exchange coupled to the pinned layer of the SAF to fix the magnetization of the pinned layer in a predetermined direction. The pinning layer is typically formed of an antiferromagnetic material. In antiferromagnetic materials, the magnetic moments of adjacent atomic planes are aligned in alternating directions and, thus, there is no net magnetic moment in the material.

An underlayer is typically used to promote the texture of the pinning layer consequently grown on top of it. The underlayer is typically formed of a ferromagnetic material and is chosen such that its atomic structure, or arrangement, corresponds with a desired crystallographic direction.

A seed layer is typically used to enhance the grain growth of the underlayer consequently grown on top of it. In particular, the seed layer provides a desired grain structure and size. A seed layer may also be combined with the underlayer, in which combined layer performs the functions of both the underlayer and the seed layer.

One principal concern in the performance of TMR read sensors is the $\Delta R$ (the maximum absolute change in resistance of the TMR read sensor), which directly affects the magnetoresistive (MR) ratio. The TMR ratio (the maximum absolute change in resistance of the TMR read sensor divided by the resistance of the TMR read sensor multiplied by 100%) determines the magnetoresistive effect of the TMR read sensor. Ultimately, a higher TMR ratio yields a TMR read sensor with a greater magnetoresistive effect (greater sensitivity) that is capable of detecting information from a magnetic medium with a higher linear density of data.

A key determinant of the TMR ratio is the spin polarization of the sense current passing through the barrier layer. The sense current consists of majority spin electrons (spin is in the same direction of the magnetization) and minority spin electrons (spin is in the opposite direction of the magnetization). A spin polarized current has an unequal population of majority and minority spin electrons. According to the Julliere model of the TMR read sensor, the magnetoresistive effect in a tunneling junction is significantly enhanced if the sense current is spin polarized. This is because the magnetoresistive effect is determined by $\Delta R/R = 2PP'/(1-PP')$, where $\Delta R/R$ is the TMR ratio, and $P$ and $P'$ are the spin polarization ratios of the effective tunneling density of states on each side of the barrier layer. The TMR ratio reaches a maximum value for completely polarized tunneling density of states ($P=P'=1$).

Large signal output and reduced shield-to-shield spacing have made the TMR head attractive for high linear density application. However, one of the crucial factors strongly limiting the TMR sensor in recording head application is the large resistance at higher linear density, which results in large shot noise, thereby reducing the signal to noise ratio. Large resistance also increases switching time since the insulating barrier acts as a capacitor. Tremendous effort has been made to reduce the resistance-area (RA) product of the TMR sensor in the past years. The lowest reported RA product of a given TMR sensor is 5 $\Omega\mu m2$. Therefore, there is a need in the art for a TMR effect element having improved characteristics; particularly having a high TMR ratio and low resistance-area product (RA) for achieving improved head output.

The present invention addresses these and other needs, and offers other advantages over current devices.

SUMMARY OF THE INVENTION

The present invention is a tunneling magnetoresistive (TMR) stack configured to operate in a current-perpendicular-to-plane (CPP) mode, wherein a sense current flows substantially perpendicular to a longitudinal plane of the barrier layer. The TMR stack has a plurality of layers including a barrier layer. The barrier layer may made of titanium and may be oxidized with an aggressive oxidation method, such as with UV illumination, for a predetermined time period. The barrier layer may be formed on a first ferromagnetic layer before oxidation, and then a second ferromagnetic layer may be formed on the oxidized barrier layer. The TMR stack may also be annealed at a predetermined temperature for a predetermined time period. The TMR stack may exhibit an increased magnetoresistive (MR) ratio, a lower RA product, a higher breakdown voltage of the TMR stack, and greater thermal stability.

DETAILED DESCRIPTION

Figure 1:
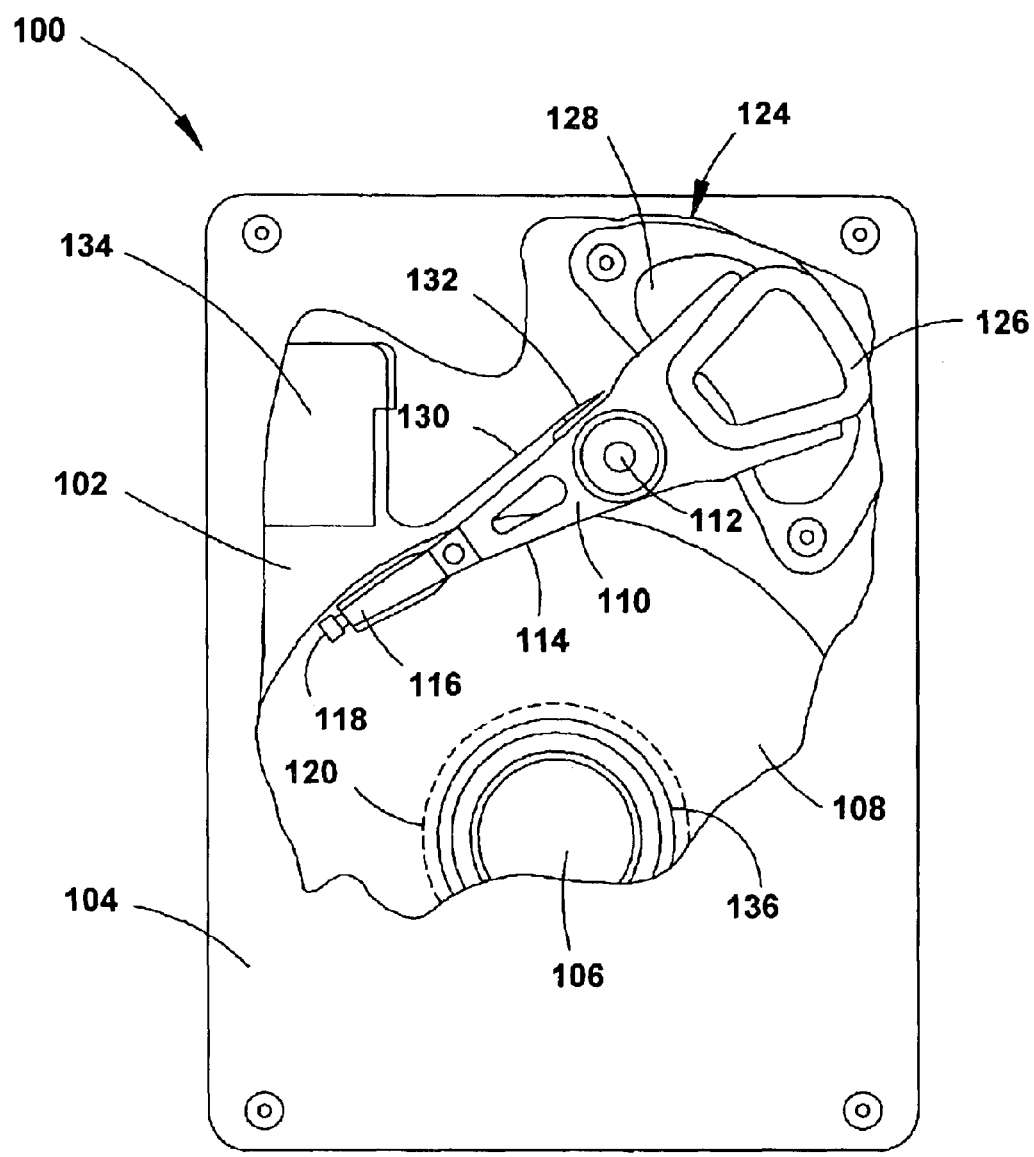
FIG. 1 is a plan view of a disc drive showing the primary internal components for incorporating features of the present invention.

A disc drive 100 constructed in accordance with a preferred embodiment of the present invention is shown in FIG. 1. The disc drive 100 includes a base 102 to which various components of the disc drive 100 are mounted. A top cover 104, shown partially cut away, cooperates with the base 102 to form an internal, sealed environment for the disc drive in a conventional manner. The components include a spindle motor 106 that rotates one or more discs 108 at a constant high speed. Information is written to and read from tracks on the discs 108 through the use of an actuator assembly 110, which rotates during a seek operation about a bearing shaft assembly 112 positioned adjacent the discs 108. The actuator assembly 110 includes a plurality of actuator arms 114 which extend towards the discs 108, with one or more flexures 116 extending from each of the actuator arms 114. Mounted at the distal end of each of the flexures 116 is a head 118 that includes an air bearing slider enabling the head 118 to fly in close proximity above the corresponding surface of the associated disc 108.

During a seek operation, the track position of the heads 118 is controlled through the use of a voice coil motor (VCM) 124, which typically includes a coil 126 attached to the actuator assembly 110, as well as one or more permanent magnets 128 which establish a magnetic field in which the coil 126 is immersed. The controlled application of current to the coil 126 causes magnetic interaction between the permanent magnets 128 and the coil 126 so that the coil 126 moves in accordance with the well-known Lorentz relationship. As the coil 126 moves, the actuator assembly 110 pivots about the bearing shaft assembly 112, and the heads 118 are caused to move across the surfaces of the discs 108 to read from or write to tracks 136 on the disc.

The spindle motor 106 is typically de-energized when the disc drive 100 is not in use for extended periods of time. The heads 118 are moved over park zones 120 near the inner diameter of the discs 108 when the drive motor is de-energized. The heads 118 are secured over the park zones 120 through the use of an actuator latch arrangement, which prevents inadvertent rotation of the actuator assembly 110 when the heads are parked.

A flex assembly 130 provides the requisite electrical connection paths for the actuator assembly 110 while allowing pivotal movement of the actuator assembly 110 during operation. The flex assembly includes a printed circuit board 132 to which head wires (not shown) are connected; the head wires being routed along the actuator arms 114 and the flexures 116 to the heads 118. The printed circuit board 132 typically includes circuitry for controlling the write currents applied to the heads 118 during a write operation and a preamplifier for amplifying read signals generated by the heads 118 during a read operation. The flex assembly terminates at a flex bracket 134 for communication through the base deck 102 to a disc drive printed circuit board (not shown) mounted to the bottom side of the disc drive 100.

Figure 2:
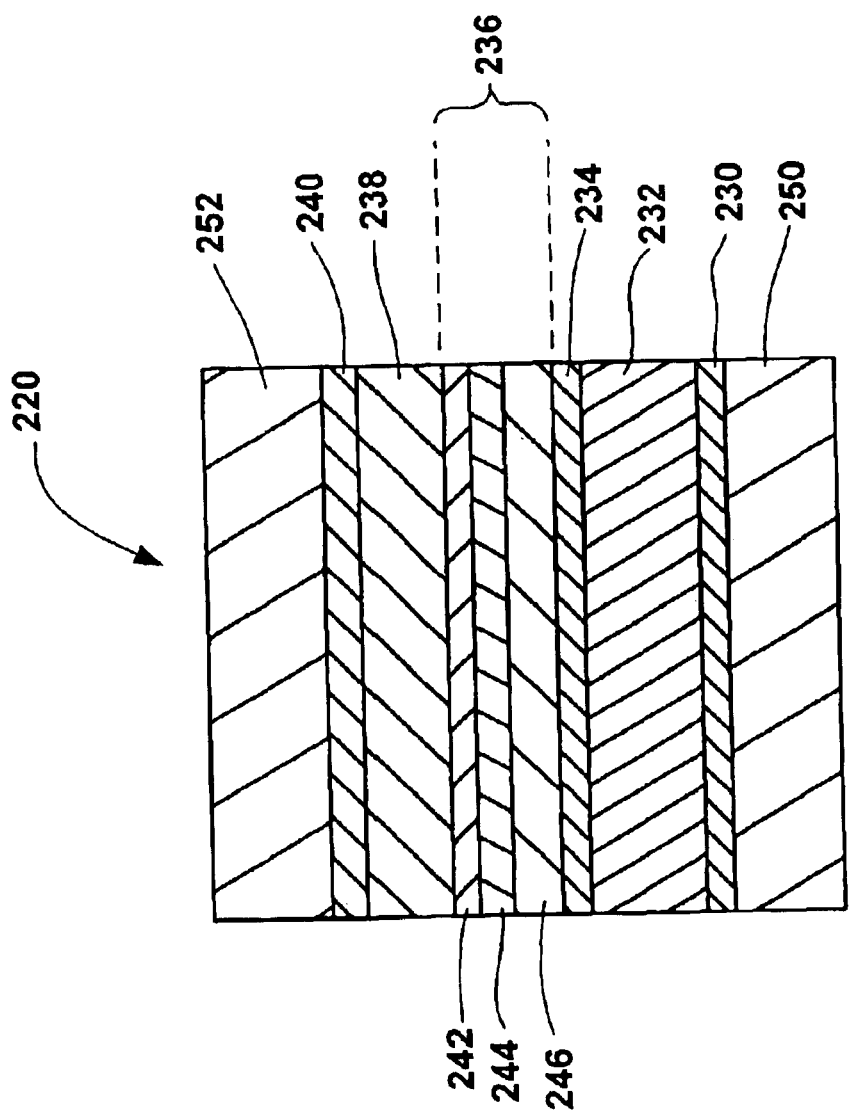
FIG. 2 is a layer diagram of a tunneling magnetoresistive stack of the present invention.

Referring now to FIG. 2, a basic design of a TMR stack 220 of the present invention is shown. TMR stack 220, when mounted to a head (not shown) that is positioned in a disc drive, is aligned relative to a memory media track so that the direction in which the layers of the stack are aligned parallel to and aligned with a direction of a disc track.

Stack 220 includes a cap/contact layer 230, a free layer 232, a barrier layer 234, a pinned layer 236, a pinning layer 238, and a seed/contact layer 240. Stack 220 is positioned between top and bottom leads 250, 252 with the cap and seed layers 230, 240 contacting top and bottom leads 250, 252, respectively. The free layer 232 is separated from the pinned layer 236 by insulating or barrier layer 234. The pinned layer 236 has a magnetization that is pinned in a predetermined orientation by the pinning layer 238, and includes a ferromagnetic pinned layer 242, a ferromagnetic reference layer 244, and a coupling layer 246 positioned between the ferromagnetic pinned layer 242 and reference layer 244. Strong antiferromagnetic interaction between the reference layer 244 and the ferromagnetic pinned layer 242, mediated by the thin spacer coupling layer 246, keeps the magnetization directions of the reference layer 244 and the ferromagnetic pinned layer 242 antiparallel. Pinned layer 236 may be referred to, in some cases, as a synthetic antiferromagnet (SAF). Permanent magnets (not shown) are typically positioned on opposite sides of stack 220 to fix the orientation of free layer 232 parallel to a surface of the disc drive memory media (disc).

The top and bottom leads 250, 252 are preferably composed of Cu or other low resistive materials. Seed layer 240 is preferably composed of Ta, Ta/NiFe, or NiFeCr/NiFe, and is positioned adjacent to bottom electrode 252. Pinning layer 238 is an antiferromagnetic material, preferably PtMn, and is positioned adjacent to seed layer 240. Pinned layer 236 is positioned such that ferromagnetic pinned layer 242 is adjacent to pinning layer 238. Ferromagnetic pinned layer 242 and reference layer 244 are preferably composed of CoFe, and coupling layer 246 is preferably composed of Ru. Free layer 232 and ferromagnetic pinned layer 242 are composed of a ferromagnetic material that preferably includes Co or a CoFe alloy composition, such as, for example, $Co_{50}Fe_{50}$. Barrier layer 234 is an insulating material, preferably selected from an oxide group consisting of HfO, TaO, NdO, TiO, MgO, AlO, and ZrO, and is positioned between pinned layer 236 and free layer 232. Cap layer 230 is preferably Ta or Cu, and is positioned between the free layer 232 and the top electrode 250.

The magnetization of pinned layer 236 is fixed while the magnetization of free layer 232 rotates freely in response to an external magnetic field emanating from an external field. Reference layer 244 and ferromagnetic pinned layer 242 are magnetically coupled by coupling layer 246 such that the magnetization direction of reference layer 244 is opposite to the magnetization direction of ferromagnetic pinned layer 242. The magnetization of ferromagnetic pinned layer 242 is pinned by exchange coupling the field between pinning layer 238 and ferromagnetic pinned layer 242. Seed layer 240 promotes the crystallographic texture of pinning layer 238. The resistance of TMR stack 220 varies as a function of an angle that is formed between the magnetization direction of free layer 232 and the magnetization of reference layer 244.

The TMR signal produced by TMR stack 220 is generated by a sense current flowing perpendicularly through the layers of stack 220 from cap layer 230 to seed layer 240, and from seed layer 240 to cap layer 230. By passing a bias current through two metallic leads that are placed in direct contact with the top and bottom leads 250, 252, conducting electrons are forced to tunnel through the insulating barrier layer 234. The output signal that results from the change of the tunneling conductance is maximum when the alignment of the reference layer 244 and free layer 232 are anti-parallel and minimum when the alignment is parallel.

The preferred embodiments of the present invention provide a novel barrier material and processing technique for producing the barrier layer to create a device having improved TMR ratio and reduced RA.

Figure 3:
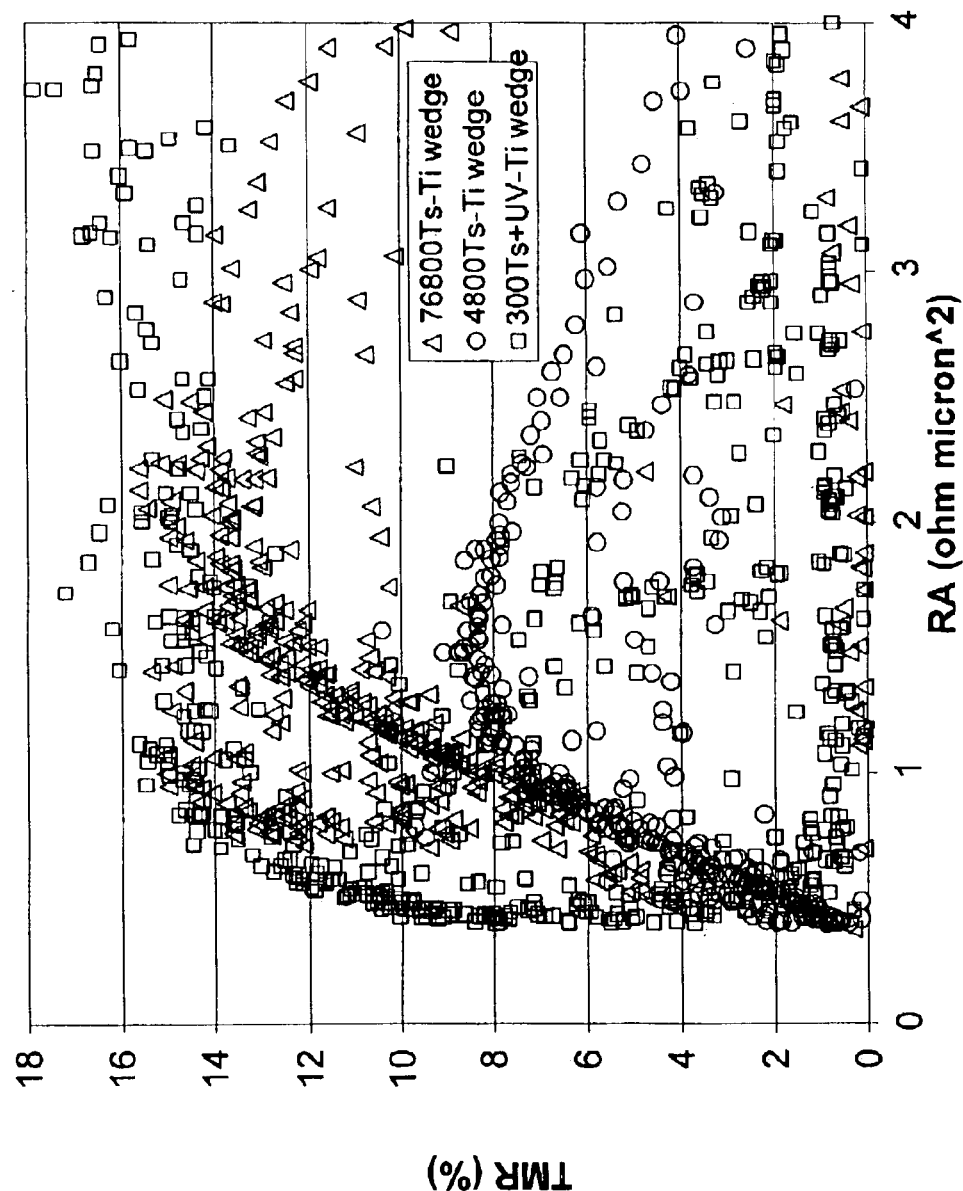
FIG. 3 is a graph showing TMR ratio versus RA for two separate barrier layers formed by natural oxidation compared to a barrier layer formed by ultraviolet (UV) oxidation.

FIG. 3 is a graph showing TMR ratio versus RA for two separate barrier layers formed by natural oxidation compared to a barrier layer formed by ultraviolet (UV) oxidation. TMR signal is measured on the vertical scale as a percentage of TMR signal (that is, TMR ratio), and RA is measured on the horizontal scale in units of ohms·micron$^2$. Data points represented by the triangles are for a titanium oxide barrier layer oxidized by natural oxidation at 76,800 Ts (time-seconds) and data points represented by the circles are for a titanium oxide barrier layer oxidized by natural oxidation at 4,800 Ts. Datapoints represented by the squares are for a titanium oxide barrier layer oxidized according to a preferred embodiment of the present invention utilizing UV oxidation at 300 Ts with 1-Torr pressure of oxygen for 300 seconds. FIG. 3 illustrates that UV oxidation results in a consistently higher TMR signal and lower RA than natural oxidation.

The barrier metal for the samples illustrated in FIG. 3, were deposited using a physical vapor deposition process (sputtering), however, the material could be deposited using a chemical deposition process (atomic layer deposition). From the information depicted on the graph, it can be seen that the oxidation performed according to a preferred embodiment of the present invention is superior to a natural oxidation process. The magnetic resonance is larger for a smaller RA for the titanium oxide layer produced with UV oxidation than it is for other known barrier layer materials using different techniques.

Other oxidation processes, such as plasma and atomic source, can be utilized as substitutes for natural or UV oxidation. However, these methods, to this point, have not provided the superior results of UV oxidation. UV oxidation is believed to have significant advantages over other processes such a natural, plasma and others. Benefits include but are not limited to: 1) a rapid process time which is central to high throughput fabrication, 2) excellent compatibility with thin barriers and low RA processing, 3) independent control of oxygen environment conditions and barrier formation by optically driven enhancement, and 4) elimination of difficult to control plasma environments and negative substrate interactions.

There may be improved performance (higher TMR signal and lower RA) of the device with increasing doses of oxygen and aggressive oxidation processes (e.g., high pressure, UV, plasma or other). This distinction has not been pointed out in earlier techniques such as that described in U.S. Pat. No. 6,335,081, which indicates that Ti oxide, having a single oxidation state of $TiO_2$, could be utilized as a low conductivity barrier material. The exact composition of this barrier material of the present invention may utilize any Ti oxidation state, including, but not limited to TiO, $TiO_2$, $Ti_2O_3$, and $Ti_3O_5$. In practice, it appears that the interfaces between the barrier and the ferromagnetic layers (above and below the barrier) are not well defined. There may be a low concentration of oxygen in the ferromagnetic layers and the ferromagnetic layers may be chemically mixed with the barrier layer. As a result, the Ti oxide composition may vary throughout the barrier layer and the interface between the barrier layer and the ferromagnetic layers. The actual oxide barrier composition may be very different compared to a stoichiometric oxide slab, such as the test slabs represented in FIGS. 3–6.

Figure 4:
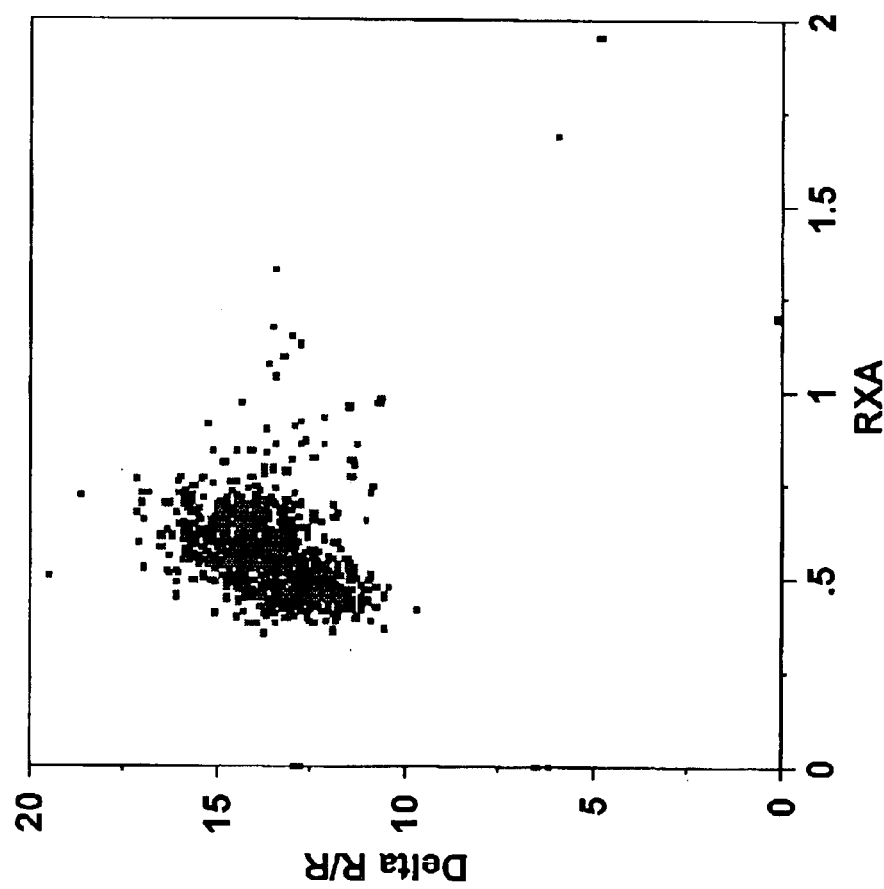
FIG. 4 is a graph of ΔR/R versus RA for a device having a Ti oxide barrier layer according to the invention.

FIG. 4 is a graph of $\Delta R/R$ versus RA for a device having a Ti oxide barrier layer according to the present invention. A single barrier layer is plotted having a Ti oxide area of about 0.107 $\mu m^2$. The thickness of the Ti oxide barrier layer is about 3.5 Å. The barrier layer was oxidized with 1 Torr of pressure for 300 seconds under UV illumination to create a Ti oxide stack. This graph illustrates a tight distribution of test results in ranges of $\Delta R/R$ and RA that are superior compared to known barrier layers.

Figure 5:
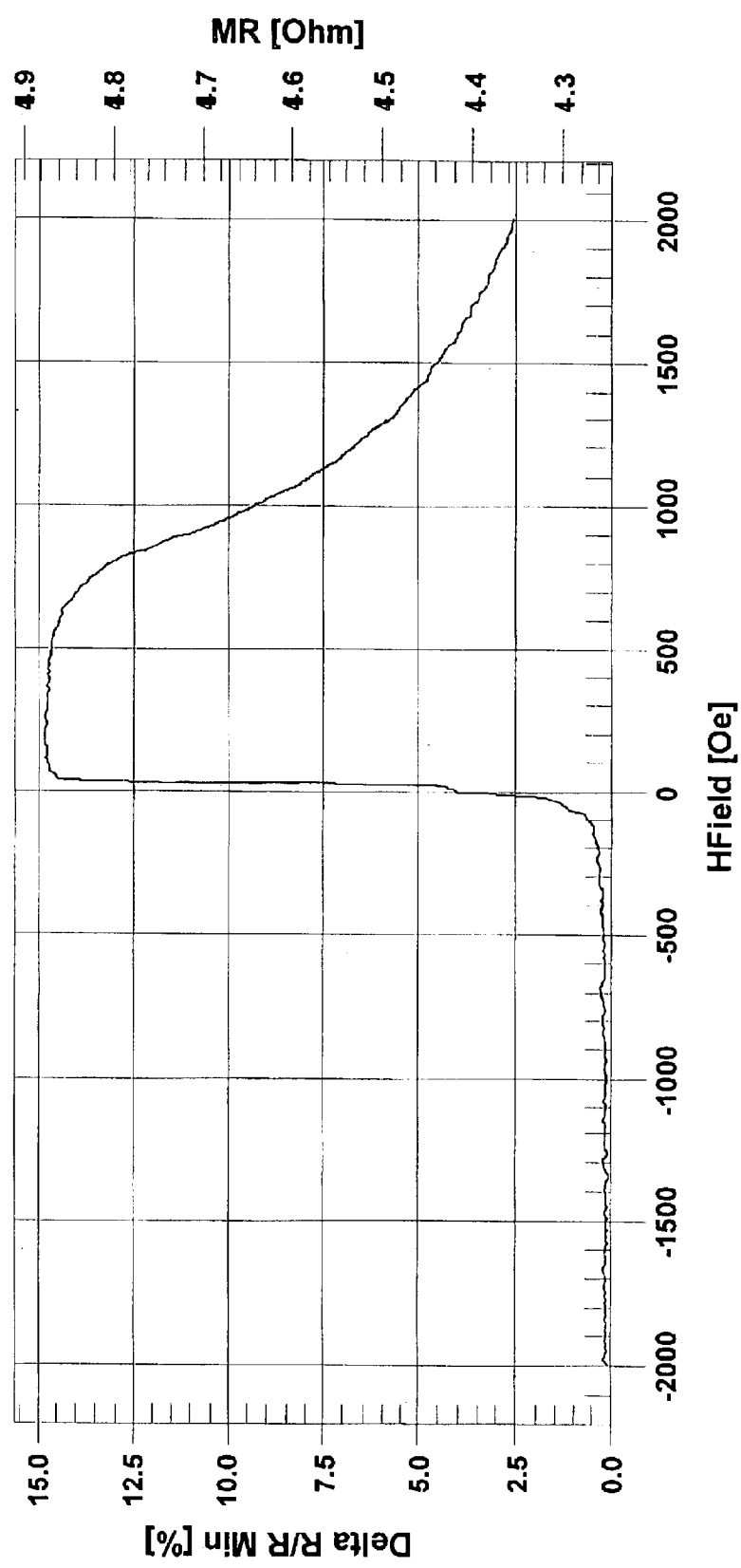
FIG. 5 is a transfer curve for the data shown in FIG. 4.

FIG. 5 shows a transfer-curve for a device consisting of a Ti-oxide barrier with a 25 Å $Co_{90}Fe_{10}$ pinned layer and a 10 Å $Co_{90}Fe_{10}$+25 Å $Ni_{85}Fe_{15}$ freelayer. The barrier was formed from a 3.5 Å Ti metal film oxidized by a simultaneous exposure to UV illumination having a wavelength of 172 nm in an environment of 1 Torr of pressure for 300 seconds. A transfer-curve of FIG. 5 represents performance of the device depicted in FIG. 4. In FIG. 5, $R_{min}$ is approximately 4 ohms (resulting in RA of approximately 0.6 $\Omega \cdot \mu m^2$); and the TMR ratio is approximately 15%. The pinned and free layers may have different compositions that may be more sensitive to the oxidation composition of the barrier layer.

Figure 6:
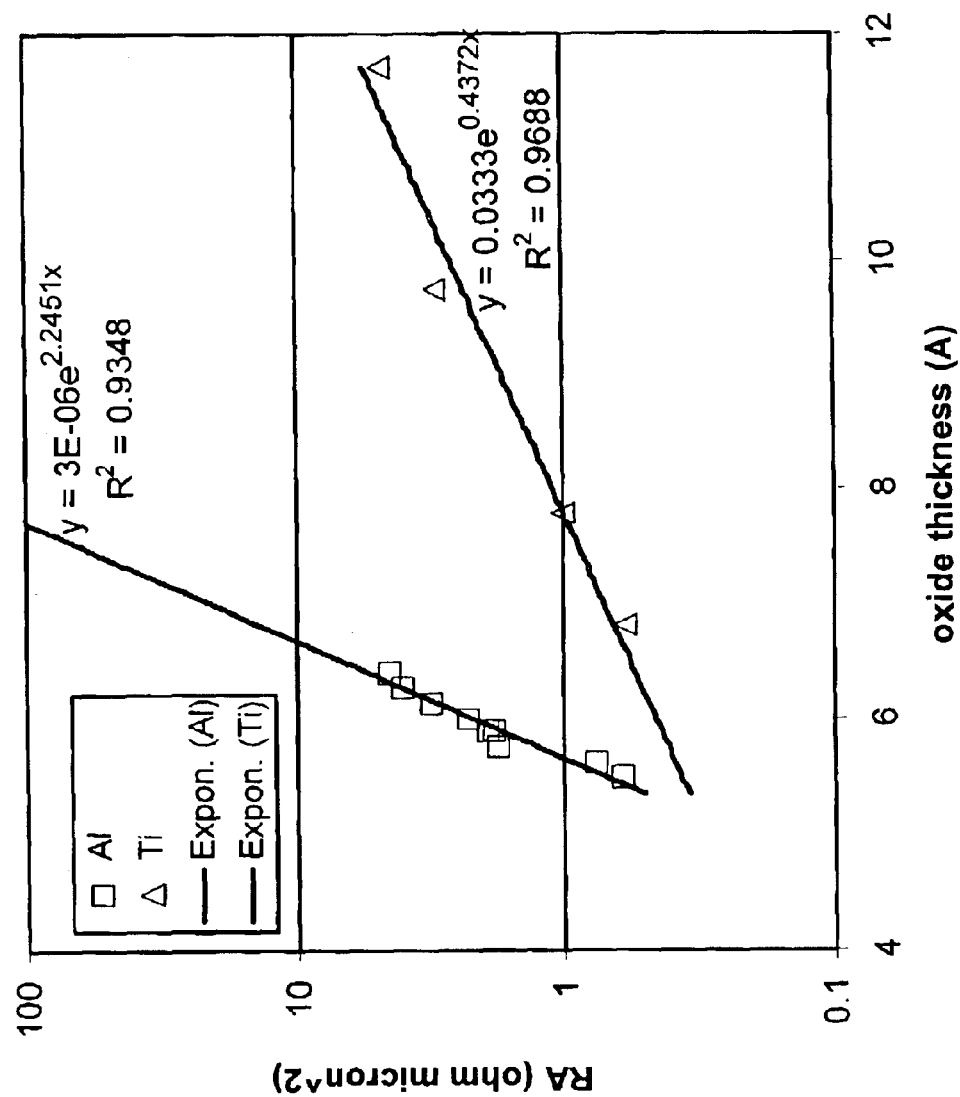
FIG. 6 is a graph of the RA versus oxide thickness for an aluminum barrier layer as compared to a titanium barrier layer according to the invention.

FIG. 6 is a graph of the RA versus oxide thickness for aluminum and titanium barrier layers. Both materials show a correlation to an exponential fit. The data can be fit using Simmon's model to extract activation energies for tunneling in a TMR stack. Simmon's model indicates the tunneling barrier for aluminum oxide is approximately 3 eV and for titanium oxide is approximately 0.5 eV. FIG. 6 further shows that Ti-oxide barriers allow a thicker barrier for a given RA compared to most other materials, such as Al-oxide, that have a higher barrier energy. This is particularly significant if one assumes that the barrier breakdown voltage increases substantially with barrier thickness.

FIG. 6 also shows that this UV oxidation process can be applied over a wide range of barrier thickness (metal thickness of between about 3 to 10 Å), so as to produce an oxidized barrier thickness of between about 6 to 20 Å. Tests have shown that metal volume expansion upon oxidation of about 100% may be desirable. The thickness of the barrier layer is desired to be as thin as possible for reducing the resistance of the element. However, if the thickness becomes thin enough to cause pin holes, a leakage current is generated, which is not preferred.

The device resistance (RA) is exponential dependent on barrier thickness. The lowest device resistance is coincident with the thinnest barrier, and the device resistance (RA) increases as the thickness of the barrier is increased. Typically, useful device resistance is determined by current pre-amplifier capability. The maximum input impedance of a pre-amp according to the present invention is approximately 1000 ohms, although a device RA of as low as 25 ohms may be possible. A preferred range of sensor RA product is from about 0.1 ohm-micron$^2$ to about 500 ohm-micron$^2$, although RA values of up to 2000 ohms may be tolerated for some MRAM applications.

Figure 7:
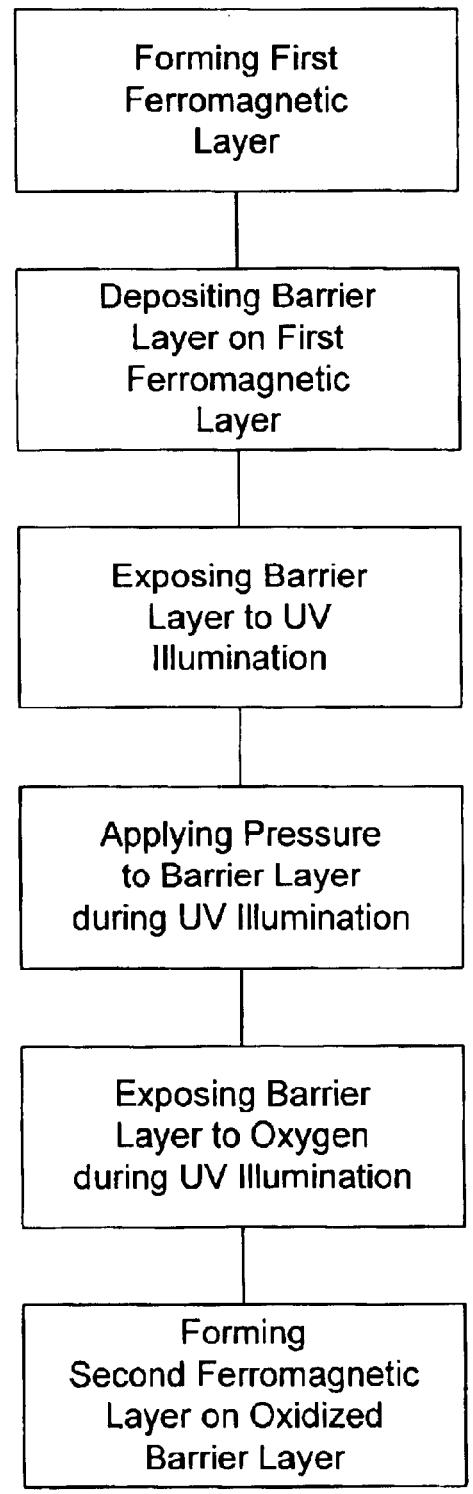
FIG. 7 is a flow chart depicting the process of making a TMR element having a barrier layer according to the invention.

FIG. 7 is a flow chart depicting the process of making a TMR element according to a preferred embodiment of the present invention. The barrier may be fabricated by sputter deposition or atomic layer deposition of a thin layer of titanium, followed by oxidation of the barrier layer in a partial pressure of oxygen using UV illumination to oxidize the Ti layer. The process may also include the steps of forming a ferromagnetic layer and forming the barrier layer on the ferromagnetic layer. Other steps of the process may include forming a second ferromagnetic layer on the barrier layer after oxidation of the barrier layer has occurred, and annealing the TMR stack at a given temperature for a predetermined time period. The ferromagnetic layers may be either a pinned or pinning layer of a TMR stack. UV illumination may be applied with or without a partial pressure and oxygen saturation, and may be applied for a predetermined time period.

The present invention encompasses several useful ranges for oxidation duration, oxidation pressure, UV wavelength, UV lamp flux, UV lamp distance from the sample, barrier layer thickness, annealing time and annealing temperature as follows.

Oxidation duration of about 50 to 1000 seconds is preferred, with oxidation duration of about 100 to 500 seconds being more preferred, and oxidation duration of about 300 second being most preferred. The oxidation duration may vary greatly depending on other variable of the oxidation process.

Oxidation pressure of about 0.05 to 10 Torr is preferred, with oxidation pressure of about 0.1 to 2 Torr being more preferred, and oxidation pressure of about 1 Torr being most preferred. Increases in oxidation pressure typically result in a shorter required oxidation time, and visa versa.

UV wavelength of about 150 to 350 nm is preferred, with UV wavelength of about 170 to 300 nm being more preferred, and UV wavelength of about 172 nm being most preferred, as shown in the results of FIG. 3–6 described above.

UV lamp flux of about 1 to 500 mW/cm$^2$ is preferred, with UV lamp flux of about 5 to 50 mW/cm$^2$ being more preferred, and UV lamp flux of about 50 mW/cm$^2$ being most preferred. UV lamp flux may be higher or lower depending on the duration and pressure variables.

UV lamp distance of about 150 to 300 cm is preferred, with UV lamp distance of about 200 to 250 cm being more preferred, and a UV lamp distance of about 230 cm being most preferred. UV lamp distance may be greater or smaller depending again on the duration and pressure variables.

The thickness of a Ti barrier layer that is oxidized according to the above methods may be about 2.5 to 10 Å, with a thickness of about 3 to 7 Å being more preferred, and a thickness of about 3.5 Å being most preferred. In other embodiments, the Ti barrier layer may be exchanged for different materials having the same or similar properties and benefits of Ti when used as a barrier layer material that is oxidized.

Annealing the TMR stack may provide additional advantages and improved performance of a. Annealing at a temperatures between about 0 to 400° C. is preferred, with temperatures between about 220 to 280° C. being more preferred, and a temperature of about 250° C. being most preferred for the most preferred values of variables listed above.

Annealing duration of about 0 to 10 hours is preferred, with annealing duration of about 2 to 6 hours being more preferred, and annealing duration of about 4 hours being most preferred for TMR stacks when using a temperature of about 250° C. The annealing duration may be significantly shorter than 4 hours when using alternative annealing methods from those commonly used. One alternative annealing method is known as rapid thermal processing, which uses a flash of intense heat (about 400 to 600° C.) from a lamp or the like heat source for a short time period (about 10 to 60 seconds). Stacks for a spin valves are typically annealed using a temperature of about 300° C. for about 6 hours.

In further embodiments, the process may include the use of several oxidation techniques for oxidizing a single TMR stack, such as, for example, a combination of natural, UV, and plasma oxidation techniques. In addition to the above, a similar UV-oxidation method as disclosed herein may be utilized for other reactive compounds, such as, for example, nitride and/or oxynitride barriers. Finally, it is worth noting that the concept of this disclosure can be equally applied to any tunnel junction device including but not limited to recording heads, magnetic random access memory (MRAM) and TMR sensors.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A method of manufacturing a read sensor for use in a magnetic read head the method comprising the steps of:
   depositing a first ferromagnetic layer;
   depositing a barrier layer on the first ferromagnetic layer;
   oxidizing the barrier layer with UV illumination;
   depositing a second ferromagnetic layer on the barrier layer; and
   annealing the stack.

2. The method of claim 1, wherein the barrier layer is deposited with a thickness ranging from about 2 Å to about 6 Å.

3. The method of claim 1 wherein the barrier layer is deposited by sputtering.

4. The method of claim 1, wherein the steps of depositing the barrier layer and oxidizing occur simultaneously.

5. The method of claim 1 wherein the step of oxidizing occurs under pressure of about 1 Torr of oxygen.

6. The method of claim 1 wherein the barrier layer is deposited by atomic layer deposition.

7. The method of claim 1 wherein the step of oxidizing the barrier layer is done for 300 seconds.

8. The method of claim 1 wherein the UV illumination has a wavelength of 170 nm.

9. The method of claim 1, wherein the barrier layer material comprises a TiO composition.

10. The method of claim 1, wherein the barrier layer material comprises an AlO composition.

11. The method of claim 1, wherein the UV illumination is produced by a UV lamp having a lamp flux of about 50 m W/$^2$.

12. The method of claim 1, wherein the UV illumination is applied to the barrier layer from a UV source positioned about 230 cm from the barrier layer.

13. The method of claim 1, wherein the annealing temperature is about 250° C. and the annealing time is about 4 hours.

14. A method of forming a barrier layer of a tunneling magnetoresistive head to promote an enhanced magnetoresistive response from the tunneling magnetoresistive head, comprising the steps of:

depositing a titanium barrier layer on a first ferromagnetic layer of the tunneling magnetoresistive head; and oxidizing the titanium barrier layer by exposing the titanium barrier layer to UV illumination for a predetermined time period in the range of about 50 to 1000 seconds.

15. The method of claim 14, wherein the oxidizing step is preformed under a partial pressure of oxygen in the range of about 0.05 to 10 Torr.

16. The method of claim 14, wherein the UV illumination is provided by a UV lamp, the UV lamp having a UV flux in a range of about 40 to 60 m W/cm$^2$.

17. The method of claim 14, wherein the first ferromagnetic material is chosen from a group consisting of a pinned layer and a free layer.

18. The method of claim 14, wherein the UV illumination is provided by a UV lamp, the method further comprising the step of positioning the UV lamp within a range of about 150 to 300 cm from the deposited titanium barrier layer during the oxidizing step.

19. The method of claim 14, further comprising the step of forming a second ferromagnetic layer on the barrier layer after the oxidizing step.

20. The method of claim 14, wherein the UV illumination has a wavelength in the range of about 100 to 300 nm.

21. The method of claim 14, further comprising the step of annealing the barrier layer after the oxidizing step.

22. The method of claim 21, wherein the annealing step includes exposing the oxidized barrier layer to a temperature of about 220 to 260° C. for about 2 to 6 hours.

23. A method of forming a tunneling magnetoresistive head, comprising:

forming a titanium barrier layer between opposing ferromagnetic layers; and oxidizing the titanium barrier layer with UV illumination.

24. The method of claim 23, wherein the oxidizing step includes UV illumination for a predetermined time period.

25. The method of claim 23, wherein the oxidizing step occurs under partial pressure.

* * * * *